(12) United States Patent
Edahiro et al.

(10) Patent No.: US 7,907,463 B2
(45) Date of Patent: Mar. 15, 2011

(54) NON-VOLATILE SEMICONDUCTOR STORAGE DEVICE

(75) Inventors: Toshiaki Edahiro, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 124 days.

(21) Appl. No.: 12/478,181

(22) Filed: Jun. 4, 2009

(65) Prior Publication Data
US 2009/0310422 A1     Dec. 17, 2009

(30) Foreign Application Priority Data
Jun. 11, 2008 (JP) .................................. 2008-152528

(51) Int. Cl.
G11C 7/00 (2006.01)
(52) U.S. Cl. ................................ 365/218; 365/185.29
(58) Field of Classification Search .................. 365/218, 365/185.29
See application file for complete search history.

(56) References Cited

U.S. PATENT DOCUMENTS

| 5,801,989 | A | 9/1998 | Lee et al. | |
|---|---|---|---|---|
| 6,650,571 | B2 | 11/2003 | Keays | |
| 6,819,596 | B2 | 11/2004 | Ikehashi et al. | |
| 7,196,934 | B2 * | 3/2007 | Chevallier | 365/185.22 |
| 7,366,020 | B2 | 4/2008 | Choi | |
| 2008/0253181 | A1 | 4/2008 | Edahiro et al. | |

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

A controller repeats an erase operation, an erase verify operation, and a step-up operation. A first storage unit stores a value of an erase start voltage applied first as an erase voltage when a series of erase operations are executed. A second storage unit stores a value of an erase completion voltage which is an erase voltage when erasure of data is finished in the erase operation and the erase verify operation. A first comparator compares the erase completion voltage with the erase start voltage each time the erase operation is executed. When the first comparator determines that the erase completion voltage is larger than the erase start voltage, a counter counts up a count value. When the count value becomes larger than a predetermined value, a second comparator updates a value of the erase start voltage stored in the first storage unit.

18 Claims, 8 Drawing Sheets

NON-VOLATILE SEMICONDUCTOR STORAGE DEVICE

CROSS REFERENCE TO RELATED APPLICATIONS

This application is based on and claims the benefit of priority from prior Japanese Patent Application No. 2008-152528, filed on Jun. 11, 2008, the entire contents of which are incorporated herein by reference.

BACKGROUND OF THE INVENTION

1. Field of the Invention

The present invention relates to an electrically rewritable non-volatile semiconductor storage device.

2. Description of the Related Art

A cell array of a NAND flash memory is composed of NAND cell units each having a plurality of memory cells connected in series. Each of the NAND cell units has both ends each connected to a bit line and a source line through a selection gate transistor.

Control gates of the memory cells in the NAND cell unit are connected to different word lines, respectively. In a NAND flash memory, a plurality of memory cells share source regions and drain regions, and are connected in series. Also, the plurality of memory cells share a selection gate transistor, a bit line contact and a source line contact. Accordingly, a size per a unit memory cell can be reduced. Furthermore, since a word line and a device region of memory cells are formed to have a shape of a simple stripe, the NAND flash memory is easy to be miniaturized. Thus, a flash memory having a large capacity is realized.

Furthermore, the NAND flash memory writes (programs) and erases data by simultaneously flowing an FN tunnel current in many cells. Specifically, a group of memory cells that share one word line configure one page or two pages, and data write (program) is performed per a page. Data erase is performed per a block. A block is defined as a group of NAND cell units that share word lines and selection gate lines.

Furthermore, when a NAND flash memory erases data per a block, it is necessary to perform a verify-read-out operation (erase verify operation) for confirming whether or not an erase state of a predetermined threshold value range is obtained (for example, JP H09-180481).

When it is judged that data is not sufficiently erased in the erase verify operation, an erase voltage is increased stepwise (stepped up), and the same erase operation and the same erase verify operation are repeated.

By the way, when data write or data erase is repeatedly conducted to a memory cell many times, charges trapped in a charge accumulation film of the memory cell gradually become hard to flow out. In that case, even if an erase operation is repeated the same number of times as before, a threshold voltage of the memory cell does not easily drop. Accordingly, if a number of repetition of the write/erase operation for a certain memory cell increases, it is necessary to increase a number of repetition of the erase operation and the erase verify operation (the erase voltage is also stepped up and increased).

The increase of the number of repetition of the erase operation prolongs an erase time; thereby an overall performance of a non-volatile semiconductor storage device is lowered. Accordingly, it is desired to reduce a number of repetition of the erase operation as less as possible.

SUMMARY OF THE INVENTION

In an aspect the present invention provides a non-volatile semiconductor storage device having a memory cell array to which electrically rewritable non-volatile memory cells are disposed and a controller in charge of a control for repeating an erase operation for applying an erase voltage to the memory cells to erase data, an erase verify operation for confirming whether or not data has been erased, and a step-up operation for increasing the erase voltage by a predetermined step-up voltage when erasure of the data is not finished, the controller comprising:

a first storage unit configured to store a value of an erase start voltage applied first as the erase voltage in a series of the erase operations;

a second storage unit configured to store a value of an erase completion voltage as the erase voltage when the data has been erased after the erase operation and the erase verify operation is executed;

a first comparator for comparing the value of the erase completion voltage with the value of the erase start voltage each time the erase operation is executed;

a counter for counting up a count value when the first comparator determines that the value of the erase completion voltage is larger than the value of the erase start voltage; and a second comparator for updating a value of the erase start voltage stored in the first storage unit when the count value becomes larger than a predetermined value.

DETAILED DESCRIPTION OF THE EMBODIMENTS

Figure 1:
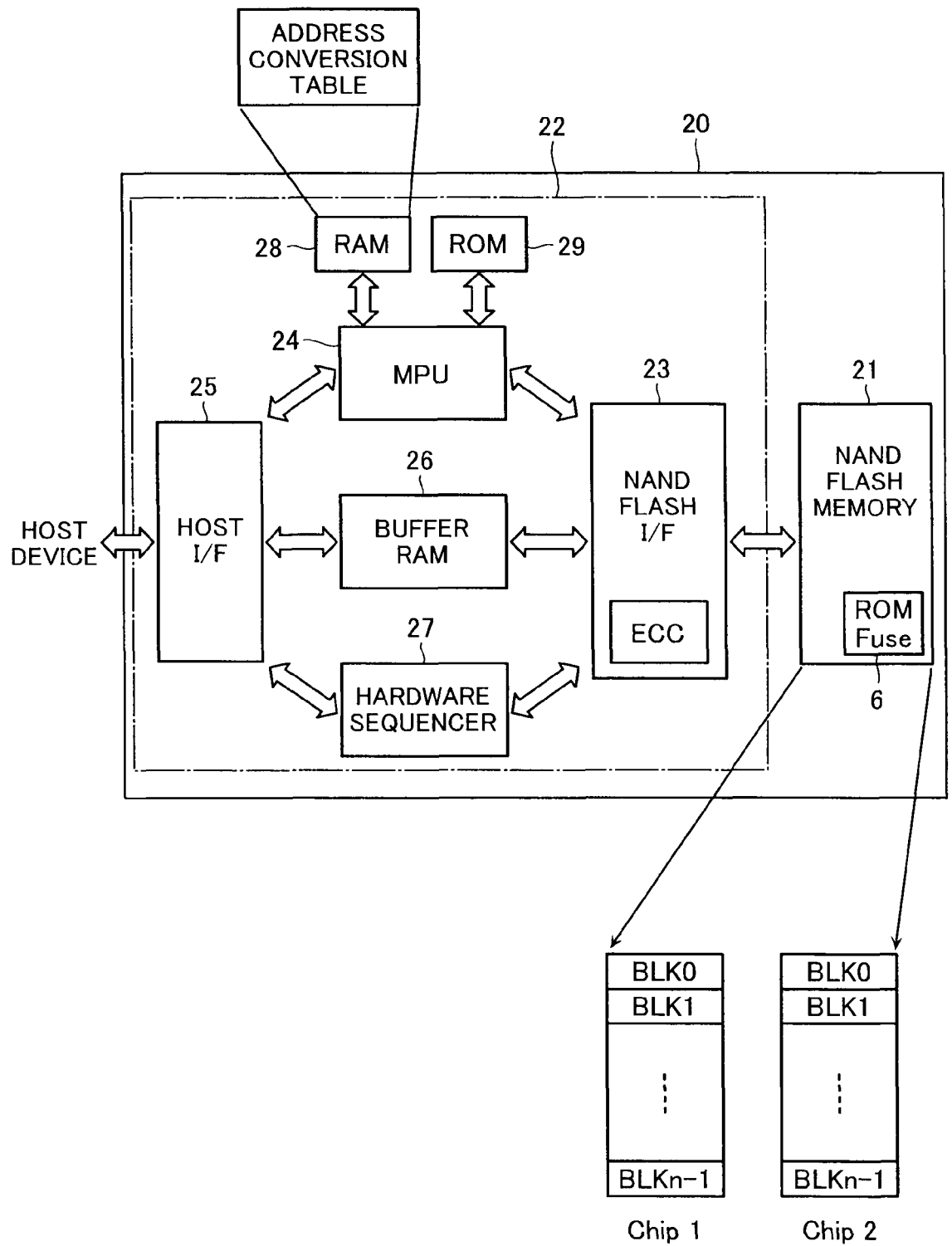
FIG. 1 shows an arrangement of a memory card 20 to which a non-volatile semiconductor device according to a first embodiment of the present invention is applied.

Next, embodiments of the present invention will be explained in detail referring to the drawings.

First Embodiment

FIG. 1 shows an arrangement of a memory card 20 to which a non-volatile semiconductor device according to a first embodiment of the present invention is applied. The memory card 20 comprises a module which is composed of a NAND flash memory chip 21 (which may be simply called the memory chip 21 hereinafter) and a memory controller 22 for controlling the read/write thereof.

The NAND flash memory chip 21 may be composed of a plurality of memory chips. Although FIG. 1 shows two memory chips Chip 1, Chip 2, they can be also controlled by the one memory controller 22. Note that each flash memory chip 21 has a ROM fuse 6 for holding various types of initialization setting data.

The initialization setting data stored in the ROM fuse 6 includes, for example, defect replacement data (redundancy data), and voltage setting data. The voltage setting data includes, for example, trimming data of various voltages, initial values of the various voltages that is stepped up and raised, and a magnitude of the step-up width. The various types of data stored in the ROM fuse 6 are transferred and stored in one or a plurality of blocks in the memory chip 21. Further, the blocks are rewritten when voltage data is updated as described later.

The memory controller 22 is one chip controller which comprises: a NAND flash interface 23 for transferring data with the memory chip 21; a host interface 25 for transferring data with a host device (not shown); a buffer RAM 26 for temporarily holding read/write data and the like; an MPU 24 for controlling an operation of the entire memory card as well as data transfer; a hardware sequencer 27 used for a read/write sequence control and the like of firmware (FW) in the NAND flash memory chip 21; a RAM 28; and a ROM 29.

When power is supplied to the memory card 20, an initializing operation (power on/initial set-up operation) is executed to automatically read out the firmware (control program) stored in the flash the memory chip 21, and the firmware is transferred to the RAM 28 as a data register. The read-out control is executed by the hardware sequencer 27.

The firmware loaded on the RAM 28 allows the MPU 24 to create various tables on the RAM 28, to access to the flash memory chip 21 in response to a command received from the host, and to transfer and control data.

As an example, the firmware creates an address conversion table on the RAM 28 so that the address conversion table converts a logical address supplied from the host device to a physical address used in the NAND flash memory chip 21. The firmware appropriately changes the correspondence relationship between the logical address and the physical address in the address conversion table to prevent that a write/erase operation is intensively executed to a specific block BLK of the NAND flash memory chip 21. In other words, the firmware appropriately changes the correspondence relationship between the logical address and the physical address so that the number of the write/erase operation to all the blocks BLK in the memory chip 21 are made uniform.

Figure 2:
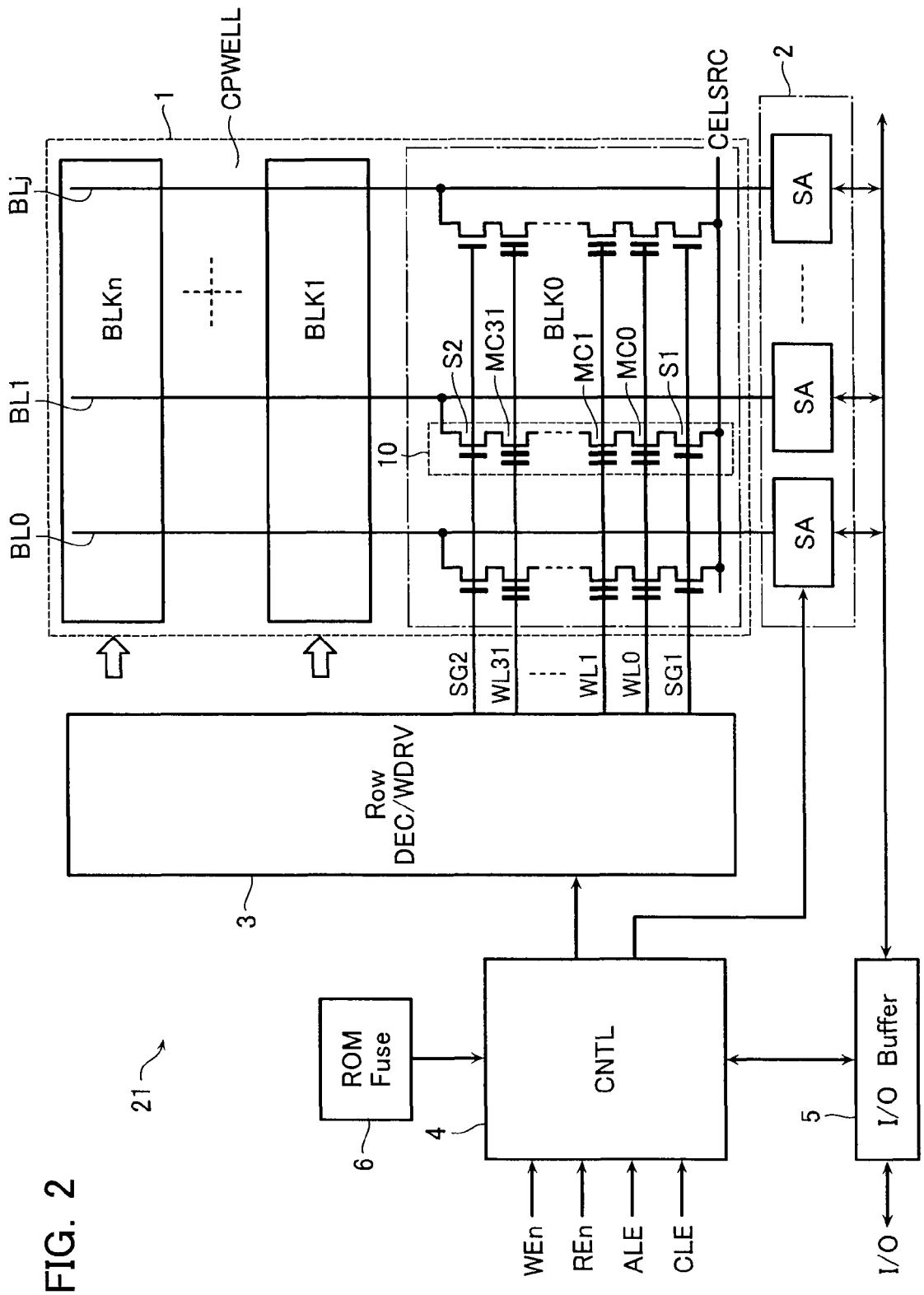
FIG. 2 shows a schematic arrangement of a NAND flash memory chip 21 according to the first embodiment.

FIG. 2 shows a schematic arrangement of the NAND flash memory chip 21 according to the first embodiment. As shown in FIG. 2, the NAND flash memory chip 21 is composed of a memory cell array 1, a sense amplifier circuit 2, a row decoder 3, a controller 4, an input/output buffer 5, and the ROM fuse 6. The controller 4 configures a controller for the memory cell array 1 together with the memory controller 22 of FIG. 1.

The memory cell array 1 is composed of NAND cell units 10 disposed in a matrix. One NAND cell unit 10 is composed of a plurality of memory cells MC (MC0, MC1, ..., MC31) connected in series and selection gate transistors S1, S2 connected to both ends thereof.

Although illustration is omitted, one memory cell MC may have, like well-known arts, a floating gate as a charge accumulation layer formed via a gate insulation film between a drain and a source, and a control gate formed on the floating gate through an interlayer insulation film. The control gate is connected to one of word lines.

A source of the selection gate transistor S1 is connected to a common source line CELSRC, and a drain of the selection gate transistor S2 is connected to a bit line BL.

Control gates of the memory cells MC in the NAND cell unit 10 is connected to different word lines WL (WL0, WL1, ..., WL31). Gates of the selection gate transistors S1, S2 are connected to selection gate lines SG1, SG2, respectively, which are disposed in parallel with the word lines WL. A plurality of memory cells sharing one word line constitutes one page or two pages. A group of a plurality of the NAND cell units 10 sharing the word lines WL and the selection gate lines SG1, SG2 constitutes a block BLK, which is a unit of data erase operation.

As shown in FIG. 2, a plurality of blocks BLK (BLK0, BLK1, ..., BLKn) are formed in the memory cell array 1 along a bit line BL direction. The memory cell array 1 including the plurality of blocks is formed in one cell well (CP-WELL) of a silicon substrate.

The sense amplifier circuit 2, which has a plurality of sense amplifiers SA constituting a page buffer for sensing read-out data and holding write data, is connected to the bit line BL of the memory cell array 1. The sense amplifier circuit 2 has a column selection gate. The row decoder (including a word line driver) 3 selects and drives a word line and a selection gate line.

The data input/output buffer 5 transmits and receives data between the sense amplifier circuit 2 and an external I/O terminal, and receives command data and address data. The controller 4 receives external control signals such as a write enable signal WEn, a read-out enable signal REn, an address latch enable signal ALE, and a command latch enable signal CLE to control overall operation of this memory device.

Specifically, the controller 4 includes a command interface and an address hold/transfer circuit, and determines whether data supplied thereto is write data or address data. The write data is transferred to the sense amplifier circuit 2 and the address data is transferred to the row decoder 3 and the sense amplifier circuit 2 according to a result of the determination.

Further, the controller 4 performs controls such as a read-out/write/erase sequence control and an controls voltages applied to the memory cell array or the like based on the external control signals.

Figure 3:
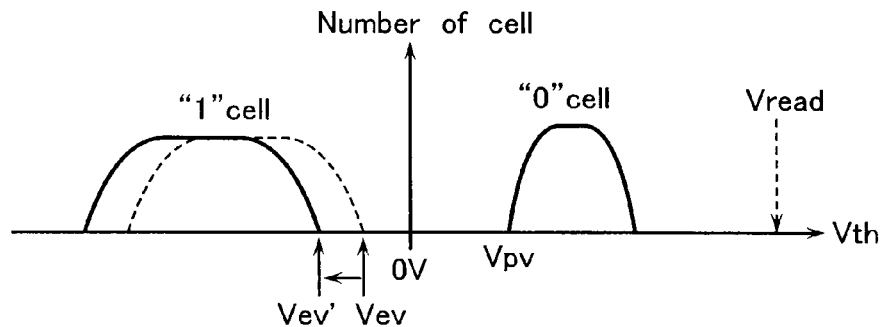
FIG. 3 shows the relationship between data stored in a memory cell MC and a threshold voltage.

FIG. 3 shows the relationship between data to be stored in the memory cell MC and a threshold voltage. When the memory cell MC stores binary data, and the memory cell MC has a negative threshold voltage, it is defined as "1" cell that stores logic data "1". In contrast, when the memory cell MC has a positive threshold voltage, it is defined as "0" cell that stores logic data "0". An operation for placing the memory cell in a data "1" state is defined as an erase operation, and an operation for placing the memory cell in a data "0" state is defined as a write operation in an arrow meaning. The NAND flash memory ordinarily erases data per a block.

[Erase Operation]

Figure 4:
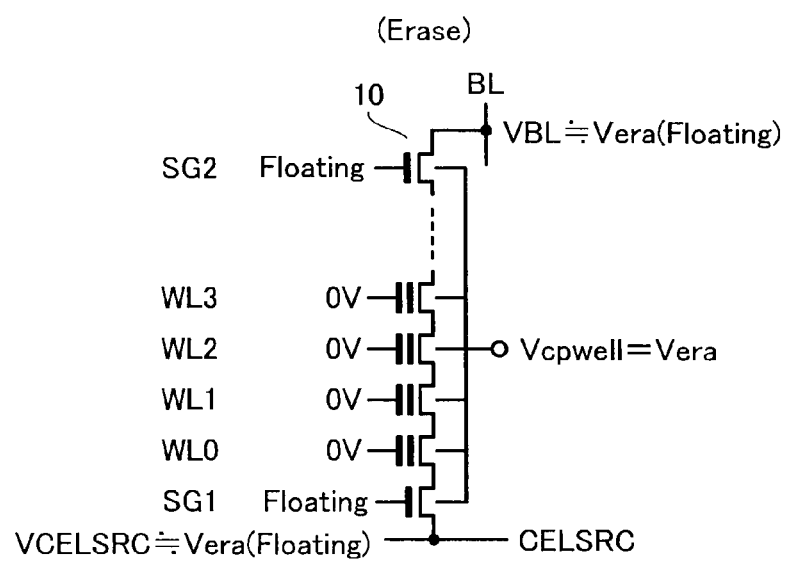
FIG. 4 shows a potential relationship in an erase operation when attention is paid to one NAND cell unit.

FIG. 4 shows a potential relationship in an erase operation when attention is paid to one NAND cell unit. The erase operation is executed per a block. An erase voltage Vera (20 V or more) is applied to the cell well (CPWELL), while 0 V is applied to all the word lines WL in a selected block to extract the electrons trapped in floating gates of the memory cells to the cell well by an FN tunnel current, thereby lowering the threshold voltage of the memory cell. At the time, the selection gate lines SG1, SG2 are placed in a floating state to prevent breakage of gate oxide films of the selection gate transistors S1, S2. Further, the bit line BL and the source line CELSRC are also placed in the floating state.

[Write Operation]

A write operation is executed per a page. In the write operation, a write voltage Vpgm (about 20 V) is applied to a selected word line in the selected block, a write intermediate voltage Vpass (about 10 V) is applied to non-selected word lines, and a power supply voltage voltage Vdd is applied to the selection gate line SG2.

Prior to the write operation, the bit lines and the NAND cell units are precharged according to write data. Specifically, when data "0" is written, a voltage of 0 V is applied from the sense amplifier circuit 2 to the bit lines. The bit line voltage is transferred up to a channel of a memory cell connected to a selected word line through the selection gate transistor S2 and non-selected memory cells. Accordingly, electrons are injected from a channel of the selected memory cell into a floating gate of the selected memory cell under the write operation condition described above, and the threshold voltage of the memory cell shifts from a negative voltage to a positive voltage ("0" cell).

When data "1" is written (i.e., when write is prohibited and data "0" is not written to the selected memory cell), the power supply voltage Vdd is applied to the bit lines. The bit line voltage is transferred to a channel of the NAND cell unit, and the channel is placed in a floating state. The voltage transferred to the channel is lower then the power supply voltage Vdd by the threshold voltage of the selection gate transistor S2. When the write voltage Vpgm and the intermediate voltage Vpass described above are applied, a channel voltage is increased by capacitance coupling, ant thus electrons are not injected into the floating gate. Accordingly, the memory cell holds the data "1".

[Read-Out Operation]

When data is read out, a read-out voltage 0 V is applied to a word line (selected word line) to which a selected memory cell in the NAND cell unit 10 is connected, whereas a read-out voltage (about 4.5 V) is applied to a word line (non-selected word line) to which a non-selected memory cell is connected. At the time, whether or not a current flows to the NAND cell unit 10 is detected by the sense amplifier circuit 2 to thereby determine data.

[Erase Verify Operation]

When data is read, it is necessary to set an enough margin between the given threshold value state and the read-out voltage, in order to guarantee reliability of data. Accordingly, a lower limit value Vpv of a threshold value of the data "0" and an upper limit value Vev of a threshold value of the data "1" must be controlled as shown in FIG. 3 in both the data erase operation and the data write operation.

Thus, in a data erase mode, after an erase voltage Vera is applied as a pulse voltage in the data erase operation described above, a verify read-out operation (erase verify read-out operation) is executed to confirm that a threshold voltage of an erase cell ("1" cell) is set to an upper limit value Vev or less. In the write operation, after a write pulse apply operation as described above is executed, a verify read-out (write verify) operation is executed to confirm that a threshold value of a "0" write cell is set to a lower limit value Vpv or more.

Figure 5:
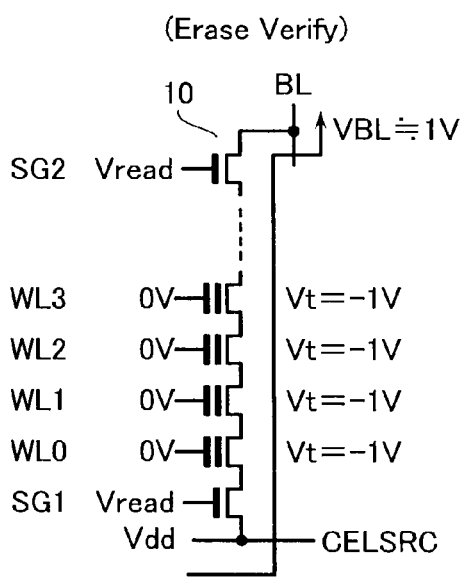
FIG. 5 shows a voltage applied to a NAND cell unit 10 in an erase verify read-out operation.

FIG. 5 shows a voltage applied to the NAND cell unit 10 in the erase verify read-out operation. The power supply voltage Vdd is applied to the cell source line CELSRC, a voltage of 0 V is applied to all the word lines of the selected block, and an intermediate voltage Vread (about 4.5 V) higher than the power supply voltage Vdd is applied to the selection gate lines SG1, SG2. The bit line BL is precharged to 0 V. When all the memory cells in the NAND cell unit are erased to an "1" state with a threshold voltage Vth=−1 V(=Vev), the above-described erase verify operation allows the bit lines to output a voltage of about 1 V. That is, to set the upper limit value Vev of the threshold value of the data "1" shown in FIG. 3 to −1 V, it is sufficient for the sense amplifier circuit 2 to detect that the bit line voltage is 1 V or more. When it is detected that the bit line voltage is 1 V or more, since all the memory cells in the NAND cell unit are sufficiently erased, the erase operation is finished. If the bit line voltage is 1 V or less, this means that the erase operation is insufficiently executed. Therefore, the erase operation is executed again.

When the erase operation is executed again, the erase voltage Vera is set to a voltage (Vera0+ΔV) that is larger than an initial value Vera0 (refer to FIG. 6) by a step-up value ΔV (>0).

When there is a cell which is insufficiently erased even by the larger erase voltage Vera=Vera0+ΔV after the step-up, a step-up operation for increasing the erase voltage by a step-up value ΔV is further executed (set to Vera=Vera0+2ΔV). Thereafter the erase operation, the erase verify operation, and the step-up operation are repeated until data erase is completed (each time the step-up operation is repeated, the erase voltage Vera is stepped up by ΔV).

Figure 7:
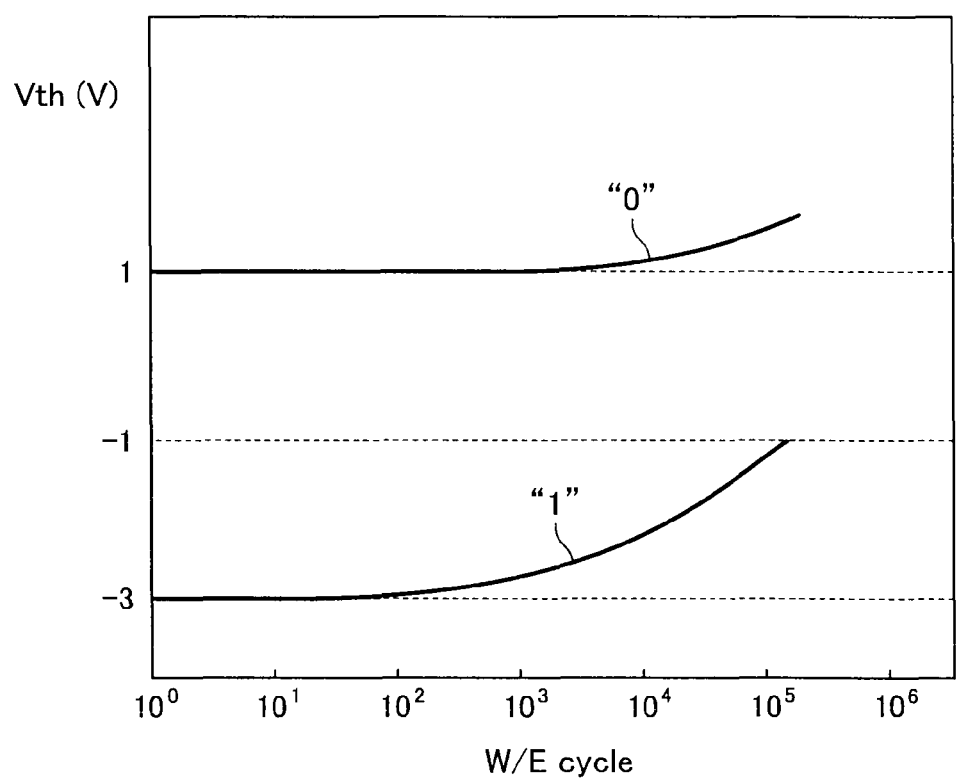
FIG. 7 is a graph showing the relationship between a number of a write/erase operation executed to one memory cell block and a threshold voltage Vth of a memory cell.

FIG. 7 shows the relationship between the number of the write/erase operation executed to one memory cell block and the threshold voltage Vth of the memory cell. As apparent from FIG. 7, an increase of the number of the write/erase operation causes a threshold voltage Vth of an "1" cell to come close to 0 V (a memory cell cannot be erased easily), whereas the increase of the number of times thereof increases a threshold voltage Vth of a "0" cell (a memory cell can be programmed easily).

Figure 6:
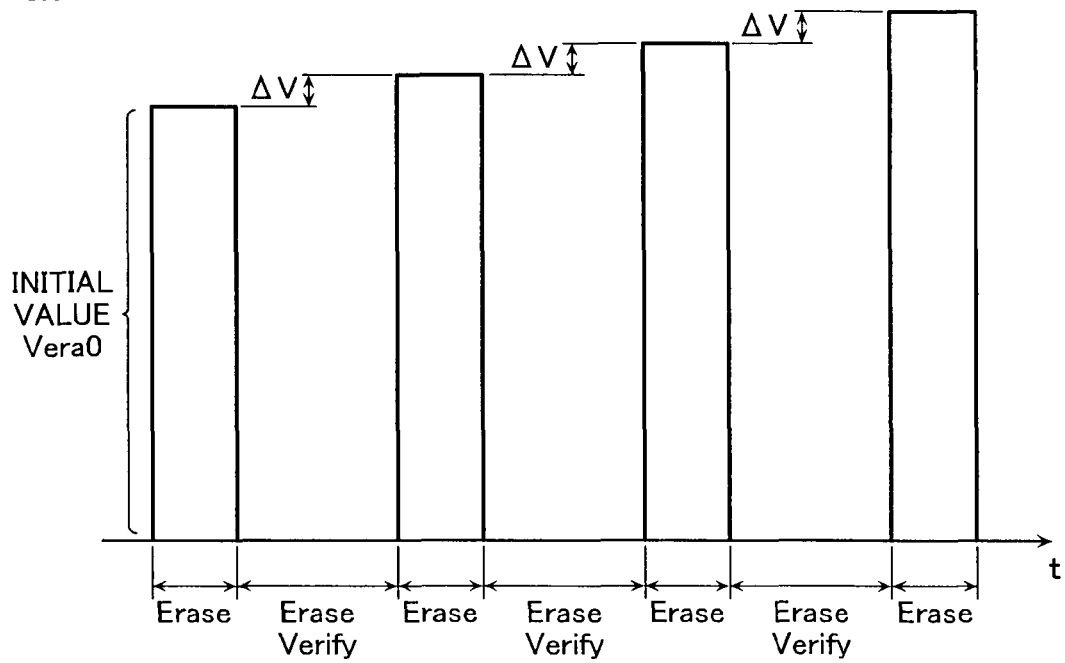
FIG. 6 is a conceptual view explaining an ordinary erase operation.

When a data erase operation is started at one block, it is not preferable to set a large erase voltage Vera from the beginning regardless that a write operation and erase operation are executed a small number of times. For example, if there is a block for which write/erase operations have been executed a small number of times because the memory device is just after shipment, the block might be erased even by an erase voltage Vera=Vera0. In this case, applying an erase voltage Vera=Vera0+ΔV or more to the block from the beginning is not preferable, because it may damage a gate oxide film and the like of the memory cell MC, and shorten a life of the memory device. This is a reason why a method of increasing the erase voltage Vera from the initial value Vera0 stepwise is employed as shown in FIG. 6.

In contrast, if there is a block for which write/erase operations have been executed many times, and the data erasure thereof has become difficult, repeatedly applying to such the block an erase voltage Vera with an insufficient magnitude for a long time may adversely damage a gate insulation film and the like of a memory cell. For example, if there is a block that cannot be erased without applying an erase voltage Vera=Vera0+2ΔV obtained by stepping up the erase voltage Vera by two steps (2ΔV), performing an erase operation for such the block with an erase voltage Vera=Vera0, or Vera=Vera0+ΔV just prolongs the time necessary for data erasure, and in addition, agate insulation film and the like of a memory cell may be damaged, which is not preferable.

From the point of view described above, the embodiment employs a system of increasing a value of a voltage Verast (hereinafter, called "erase start voltage Verast") which is applied first as the erase voltage Vera in each erase operation in accordance with an increase in the number of write/erase operations. The point will be explained referring to FIG. 8.

More specifically, the erase start voltage Verast, which is a start value or an initial value of the erase voltage Vera, is set to an initial value Vera0 at the time a memory is shipped. That is, the erase operation is started from (1) of FIG. 8, and when data is insufficiently erased with (1), the erase voltage Vera is sequentially stepped up by ΔV (from (1) to (2), then (2) to (3), next from (3) to (4)).

However, when the number of the write/erase operations increases, and there emerges a memory cell block in which data is insufficiently erased with the initial value Vera0, the erase start voltage Verast is thereafter updated to a voltage (Vera0+n·ΔV, where n shows a natural number) larger than Vera0 at a predetermined timing.

Figure 8:
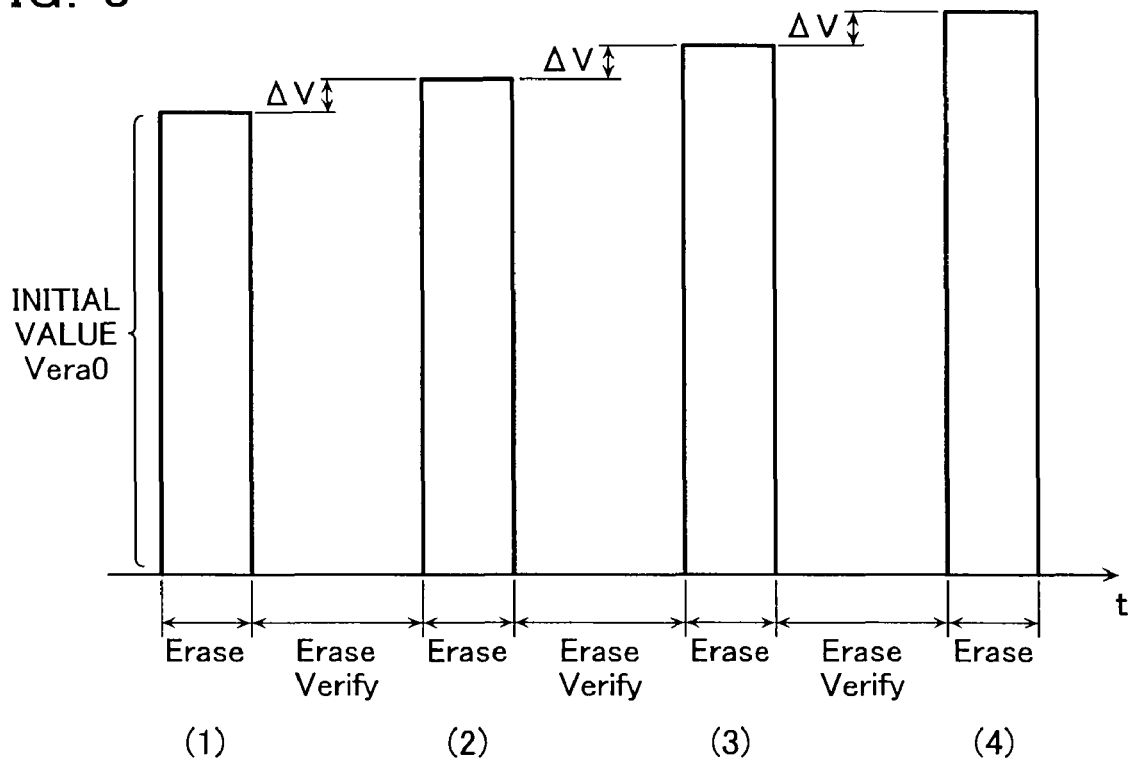
FIG. 8 is a conceptual view explaining an erase operation in the first embodiment.

More specifically, after the update is executed, an erase operation is started from, for example, (2), (3), (4) of FIG. 8 (or a larger voltage not shown) in place of (1), and when the data is insufficiently erased even by the voltage, the erase voltage Vera is more stepped up sequentially by ΔV. With this operation, when the erase operation can be easily executed because the memory is just after shipment, a large erase voltage is not wastefully applied. In contrast, when it has become hard to perform the erase operation because the number of the write/erase operations that have been already executed increased, it is possible to avoid a voltage that is insufficient for data erasure from being continuously applied and a memory cell from being damaged. Therefore, according to the semiconductor storage device of the embodiment, an increase of an erase time may be suppressed, and a damage to a memory cell may be less. As a result, a life of a memory can be long.

Figure 9:
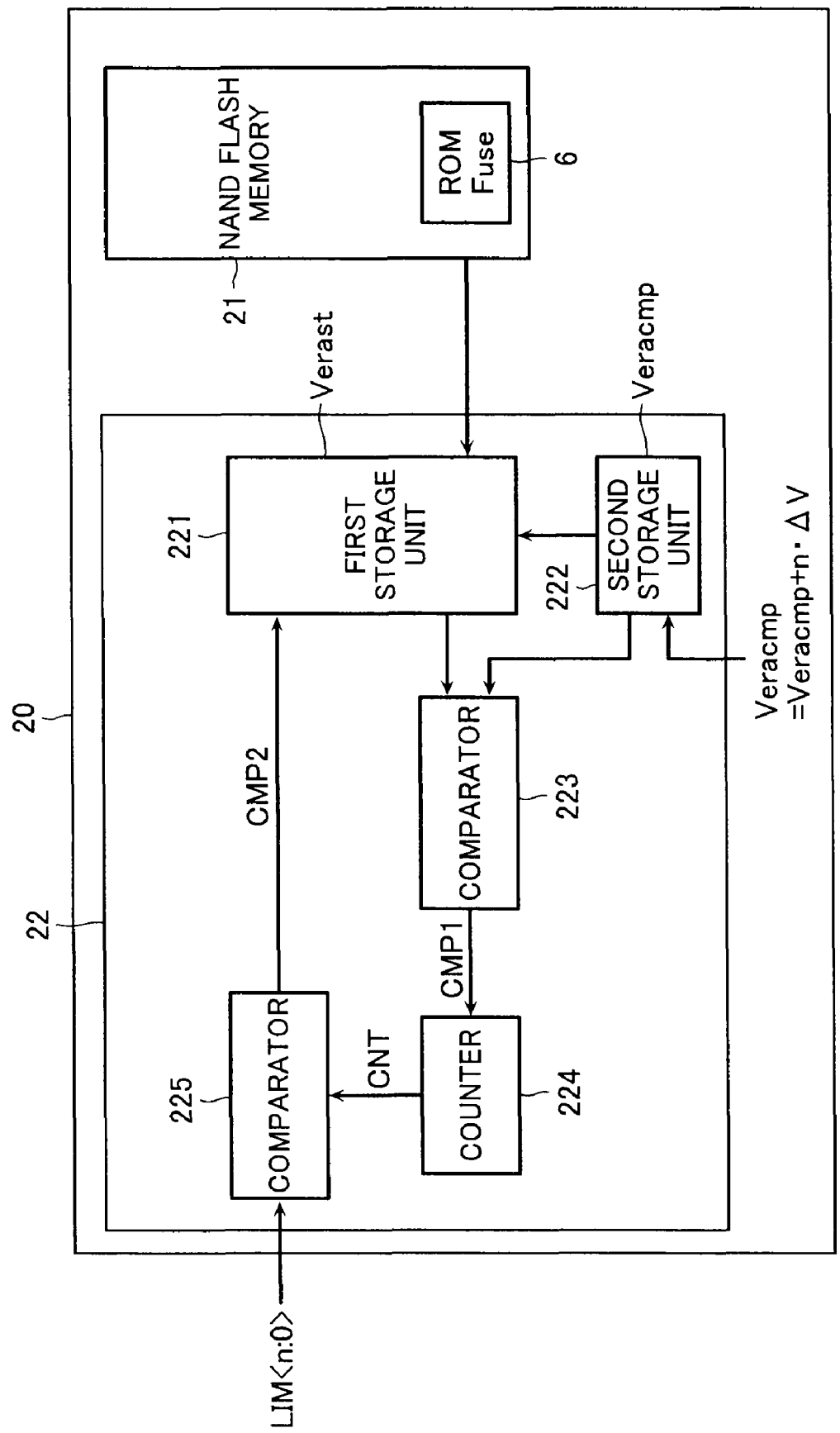
FIG. 9 is a function block diagram showing a function of a controller in charge of an erase operation.

FIG. 9 is a function block diagram showing a function of a controller in charge of an erase operation realized in the memory controller 22 by the firmware and the MPU 24 described above. The controller has a first storage unit 221, a second storage unit 222, a comparator 223 (first comparator), a counter 224, and a comparator 225 (second comparator).

The first storage unit 221 stores the erase start voltage Verast which is applied first as the erase voltage Vera when an erase operation is executed to one block. The erase start voltage Verast is included in the initialization setting data stored in the ROM fuse 6, and transferred and stored from the ROM fuse 6 to a predetermined block in the memory chip 21 after the power is on.

The second storage unit 222 stores a value of an erase completion voltage Veracmp which is an erase voltage when data erasure for one block is completed by the executed erase operation and erase verify operation (when the data of all the memory cells in one block have been erased). At the beginning of shipment of the memory device, the erase completion voltage Veracmp is set at the initial value Vera0 and is stepped up by ΔV when necessary as it becomes difficult to erase data because the number of the write/erase operation has increased.

The comparator 223 compares the erase start voltage Verast stored in the first storage unit 221 with the value of the erase completion voltage Veracmp stored in the second storage unit 222 each time the erase operation is executed, and outputs a comparison signal CMP1 when the latter value is larger than the former value.

The counter 224 has a function for counting up a count value CNT when it receives the comparison signal CMP1.

The comparator 225 compares the count value CNT with an upper limit value LIM <n:0>, and outputs a comparison signal CMP2 when the former value is larger than the latter value.

When the first storage unit 221 receives the comparison signal CMP2, it updates the erase start voltage Verast stored therein to a value stepped up by ΔV (larger than the stored value by ΔV).

Note that, when the comparison signal CMP2 is output, the MPU 24 also updates the data of a block for storing the erase start voltage Verast in the memory chip 21 to a new erase start voltage Verast. With this operation, even if power supplied to a memory is turned off, the erase operation can be started by the updated erase start voltage after power is supplied again. Note that the first and second storage units 221 and 222 may be composed of non-volatile memories.

Next, an operation of the semiconductor storage device will be explained particularly as to the erase operation.

After power is supplied, the various types of initialization setting data stored in the ROM fuse 6 are transferred to various registers (not shown), and the erase start voltage Verast in the initialization setting data is transferred and stored in a corresponding block in the memory chip 21 and to the first storage unit 221.

When the erase operation is actually executed, an erase command as to a block of a logical address is output from a host device (not shown) to the memory controller 22. When the memory controller 22 receives the erase command, it refers to the address conversion table stored in the RAM 28 to extract a physical address corresponding to the logical address.

Subsequently, the memory controller 22 reads out the erase start voltage Verast from the first storage unit 221 and starts the erase operation to the memory chip 21 according to the erase start voltage Verast and the physical address.

Thereafter, when it is found that the erase operation to the block is insufficient as a result of an erase verify operation, the erase operation is repeated again by stepping up the erase voltage Vera from Verast by ΔV (step-up operation). When the data in the block has been erased, an erase voltage at the time is stored (updated) in the second storage unit 222 as the erase completion voltage Veracmp.

Each time an erase command is output, the comparator 223 compares the erase start voltage Verast stored in the first storage unit 221 with the erase completion voltage Veracmp stored in the second storage unit 222 in parallel with the erase operation. When the former voltage is smaller than the latter voltage, the comparator 223 outputs the comparison signal CMP1. The counter 224 counts up the count value CNT.

When the erase completion voltage Veracmp is stepped up from the initial value Vera0, the comparator 223 outputs the comparison signal CMP1 each time the erase operation is executed, and the count value CNT is also counted up.

When the erase operation is repeated and the count value CNT exceeds the upper limit value LIM <n:0>, the comparator 225 outputs the comparison signal CMP2. When the first storage unit 221 and the blocks in the memory chip 21 corresponding to the ROM fuse 6 receive the comparison signal CMP2, they update the erase start voltage Verast to a higher value by the step-up value ΔV.

Note that, when it is not desired to repeatedly rewrite the data in the blocks to increase reliability of the data, the data may be held once in the memory controller 22 and may be rewritten to the blocks thereafter at an appropriate timing.

In the above-described example, after the comparison signal CMP2 is output, the erase start voltage Verast stored in the first storage unit 221 is stepped up by a voltage ΔV, and the first storage unit 221 is updated. Instead of this, the erase start voltage Verast may be stepped up and updated to a voltage equal to the erase completion voltage Veracmp updated and stored in the second storage unit 222. In this case, a time necessary to erase data can be reduced. However, when a block that is very difficult to erase happens to be selected as an erasure target just after shipment of a memory, there is a possibility that a block selected as a next erase target might be supplied with an unnecessarily high erase voltage Vera. In view of this, when update is executed by stepping up the erase start voltage Verast by ΔV, there is no possibility that such a unnecessary high voltage is applied.

Further, in the embodiment, a case is explained in which the control for uniformalizing the number of the write/erase operations at the each of the blocks are conducted using the address conversion table. However, even if such the control is executed, the number of the write/erase operation are not strictly made uniform, let alone when such the control is not executed. In this case, with regard to a block with a small number of the write/erase operation, the erase operation may be started from a voltage lower than the erase start voltage Verast stored in the first storage unit 221. For example, the initial value Vera0 as the erase start voltage may be used therefor instead of the erase start voltage Verast. In some cases, such the block with the small number of the write/erase operations is a particular block. Thus, it may be possible to store the address of such the block in advance, and the above-described erase operation may be executed when the address is designated.

Second Embodiment

Next, a second embodiment of the present invention will be explained referring to the drawings.

Figure 10:
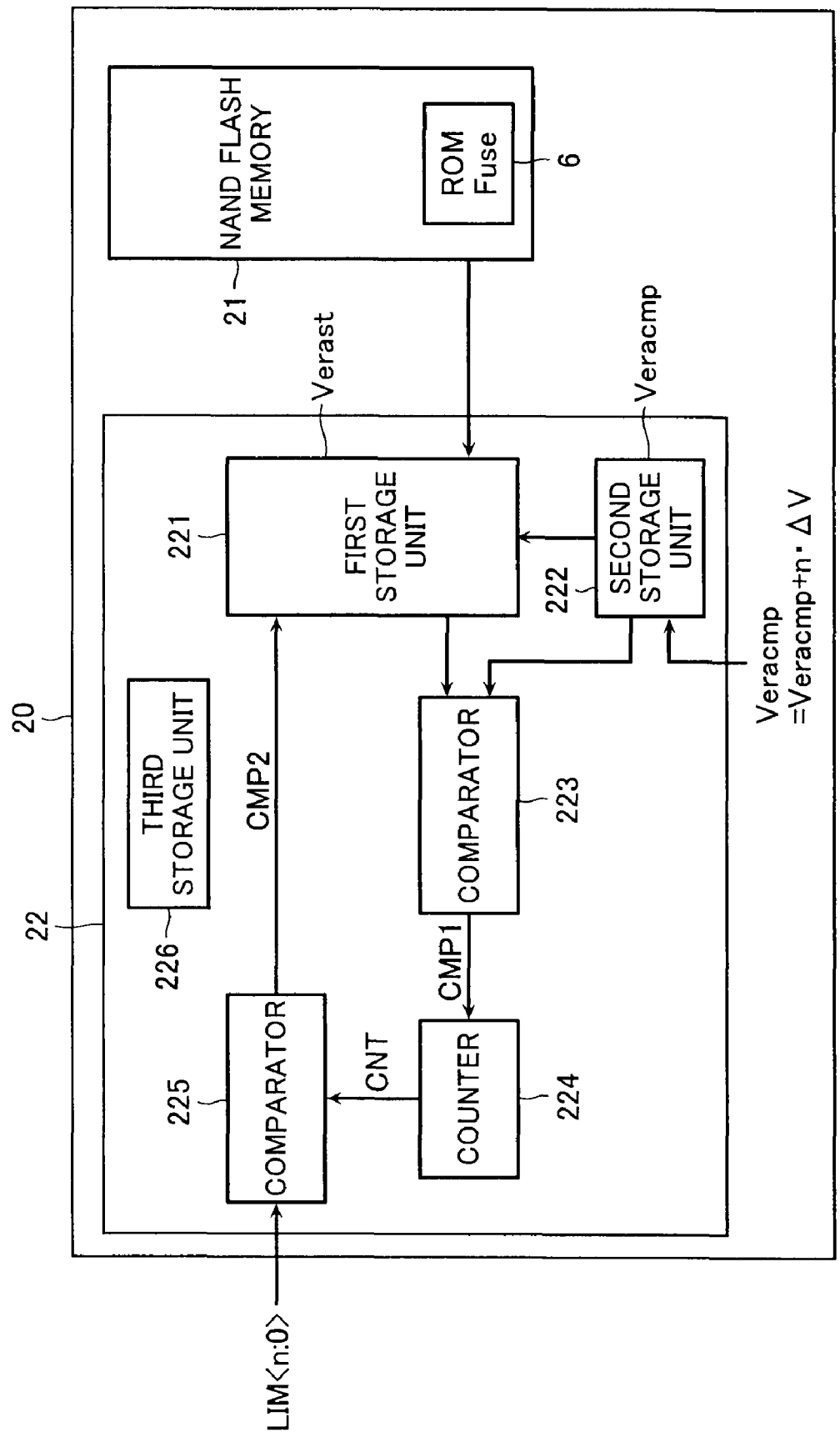
FIG. 10 shows a function block diagram of a memory controller 22 realized by a second embodiment of the present invention.

FIG. 10 shows a function block diagram of a memory controller 22 realized by a second embodiment of the present invention. Since an overall arrangement, a memory arrangement, and the like are the same as those of the first embodiment (FIGS. 1 and 2), overlapping explanation thereof is omitted hereinbelow.

As shown in FIG. 10, a semiconductor storage device of the embodiment has a third storage unit 226 for storing the number of write/erase operation for each block. The third storage unit 226 may be disposed in a memory controller 22 or may be disposed outside.

The memory controller 22 refers to the third storage unit 226 each time an erase operation is executed to specify the number of the write/erase operations for the block to be erased. As a result, when the number of the write/erase operations for the block is smaller than, for example, a predetermined value, a value smaller than a value stored in a first storage unit 221, for example, the initial value Vera0 is selected as the erase start voltage Verast in place of the value stored in the first storage unit 221 in an erase operation to the block. With this operation, since the erase start voltage can be individually set to respective blocks by the information of the number of the write/erase operations, it can be prevented to apply an unnecessarily high erase voltage to a block having a small number of the write/erase operations executed thereto. The other operations are the same as those of FIG. 1. Note that the third storage unit 226 may store only any of a number of a write operation or a number of an erase operation of each block.

Third Embodiment

Next, a third embodiment of the present invention will be explained referring to the drawings. The third embodiment is different from the embodiments described above in that when the erase start voltage Verast is updated, a soft-program voltage, which is used when a so-called soft-program operation is executed, is also updated. Since an overall arrangement, a memory arrangement, and the like are as same as those of the first embodiment (FIGS. 1 and 2), overlapping explanation thereof is omitted hereinbelow.

Figure 11:
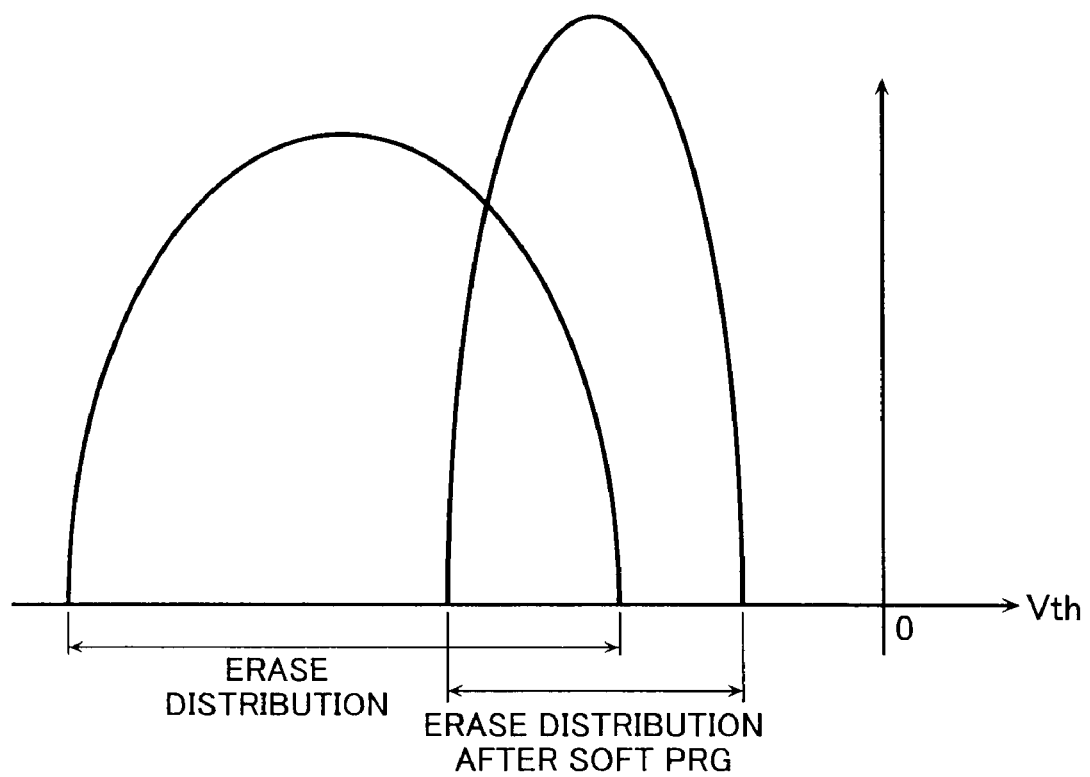
FIG. 11 is a conceptual view explaining a third embodiment of the present invention.

FIG. 11 is a conceptual view explaining the soft-program operation. The soft-program operation is a write operation for narrowing a distribution of threshold voltages of a memory cell in an erase state ("1" memory cell) to a predetermined range. More specifically, as shown in FIG. 11, the distribution of the threshold voltages of the memory cell after an execution of an erase operation may be greatly expanded depending on a difference of easiness of erasure of respective memory cells.

In such a distribution, a memory cell "1" having a lower threshold voltage requires a longer time for a data write operation than a memory cell "1" having a higher threshold voltage. Therefore, after completion of an erase operation, a predetermined soft-program voltage Vspgm is applied to a memory cell having an excessively low threshold voltage to increase the threshold voltage. With this operation, the expanded distribution of the threshold voltage is narrowed. This operation is called a soft-program operation.

In a block that experienced a small number of write/erase operations, memory cells are in such a state that they are difficult to be programmed as a whole. Therefore, when the soft-program operation is to be conducted in such the block, it is necessary to set a preferably high soft-program voltage Vspgm thereto.

In contrast, in a block which experienced a large number of write/erase operations, memory cells are in such a state that they are easy to be programmed as a whole. Therefore, when the soft-program operation is to be conducted for such the block, the soft-program voltage Vspgm may be lower than in a block which experienced a small number of the write/erase operations.

In view of the above, in the embodiment, the soft-program voltage Vspgm is stored in the first storage unit 221 in addition to the erase start voltage Verast. When the erase start voltage Verast is updated, the soft-program voltage spgm is also updated so that it has a value smaller than that before it is updated. When the soft-program is operated after the completion of the erase operation, the soft-program operation is conducted based on the soft-program voltage stored in the first storage unit 221.

According to the embodiment, a higher soft-program voltage can be supplied to a block having a small number of write/erase operation executed thereto, whereas a lower soft-program voltage can be supplied to a block having a large number of write/erase operation executed thereto. With this operation, the soft-program operation can be appropriately executed in a reduced time.

Although the embodiments of the present invention have been explained above, the present invention is not limited thereto, and various changes, additions, and the like can be made within the range which does not depart from the gist of the present invention.

What is claimed is:

1. A non-volatile semiconductor storage device having a memory cell array to which electrically rewritable non-volatile memory cells are disposed and a controller in charge of a control for repeating an erase operation for applying an erase voltage to the memory cells to erase data, an erase verify operation for confirming whether or not data has been erased, and a step-up operation for increasing the erase voltage by a predetermined step-up voltage when erasure of the data is not finished, the controller comprising:
a first storage unit configured to store a value of an erase start voltage applied first as the erase voltage in a series of the erase operations;
a second storage unit configured to store a value of an erase completion voltage as the erase voltage when the data has been erased after the erase operation and the erase verify operation is executed;
a first comparator for comparing the value of the erase completion voltage with the value of the erase start voltage each time the erase operation is executed;
a counter for counting up a count value when the first comparator determines that the value of the erase completion voltage is larger than the value of the erase start voltage; and
a second comparator for updating a value of the erase start voltage stored in the first storage unit when the count value becomes larger than a predetermined value.

2. The non-volatile semiconductor storage device according to claim 1, wherein the second comparator updates a value of the erase start voltage from a first value to a second value which is larger than the first value by the step-up voltage.

3. The non-volatile semiconductor storage device according to claim 1, wherein the controller comprises an address conversion table for storing the corresponding relationship between a logical address applied from the outside and a physical address in the memory cell array and is arranged to rewrite the address conversion table so that the number of write/erase operation executed to respective blocks in the memory cell array are made uniform.

4. The non-volatile semiconductor storage device according to claim 3, wherein
the memory cell array is a NAND memory cell array comprising a plurality of NAND cells arranged therein, each of the NAND cells including a plurality of the memory cells connected in series, and
one block is formed of the plurality of the NAND cells which share a word line for selecting the memory cells; and
the erase operation is executed per the block.

5. The non-volatile semiconductor storage device according to claim 3, further comprising an initial setting storage unit for holding a value of the erase start voltage in an initial setting operation executed after power-on,
wherein the second comparator is arranged such that it updates a value of the erase start voltage stored in the first storage unit and the initial setting storage unit when the count value becomes larger than a predetermined value.

6. The non-volatile semiconductor storage device according to claim 3, wherein:
the controller is configured such that it can execute a soft-program operation for narrowing a distribution range of the threshold voltage of the memory cell in which data is erased;
the first storage unit stores a value of a soft-program voltage applied to the memory cell when the soft-program operation is executed in addition to a value of the erase start voltage; and
the second comparator updates a value of the erase start voltage stored in the first storage unit when the count value becomes larger than a predetermined value, and updates a value of the soft-program voltage.

7. The non-volatile semiconductor storage device according to claim 3, wherein the second comparator updates a value of the erase start voltage from a first value to a second value which is larger than the first value by the step-up voltage.

8. The non-volatile semiconductor storage device according to claim 1, wherein
the memory cell array is a NAND memory cell array comprising a plurality of NAND cells arranged therein, each of the NAND cells including a plurality of the memory cells connected in series, and
one block is formed of the plurality of the NAND cells which share a word line for selecting the memory cells; and
the erase operation is executed per the block.

9. The non-volatile semiconductor storage device according to claim 8 further comprising an initial setting storage unit for holding a value of the erase start voltage in an initial setting operation executed after power-on,
wherein the second comparator is arranged such that it updates a value of the erase start voltage stored in the first storage unit and the initial setting storage unit when the count value becomes larger than a predetermined value.

10. The non-volatile semiconductor storage device according to claim 8, wherein
the controller comprises an address conversion table for storing the corresponding relationship between a logical address applied from the outside and a physical address in the memory cell array and is arranged to rewrite the address conversion table so that the number of write/erase operation executed to respective blocks in the memory cell array are made uniform.

11. The non-volatile semiconductor storage device according to claim 8, wherein:
the controller is configured such that it can execute a soft-program operation for narrowing a distribution range of the threshold voltage of the memory cell in which data is erased;
the first storage unit stores a value of a soft-program voltage applied to the memory cell when the soft-program operation is executed in addition to a value of the erase start voltage; and
the second comparator updates a value of the erase start voltage stored in the first storage unit when the count value becomes larger than a predetermined value, and updates a value of the soft-program voltage.

12. The non-volatile semiconductor storage device according to claim 8, wherein the second comparator updates a value of the erase start voltage from a first value to a second value which is larger than the first value by the step-up voltage.

13. The non-volatile semiconductor storage device according to claim 8, further comprising a third storage unit for storing the number of write operation or the number of erase operation executed for the respective blocks,
wherein the controller refers to the third storage unit to specify the number of the write operation or the number of the erase operation executed for the block to be erased, and sets, as the erase start voltage, a voltage smaller than the erase start voltage stored in the first storage unit as the erase start voltage, according to the number of the write operation or the erase operation specified.

14. The non-volatile semiconductor storage device according to claim 1 further comprising an initial setting storage unit for holding a value of the erase start voltage in an initial setting operation executed after power-on, wherein the second comparator is arranged such that it updates a value of the erase start voltage stored in the first storage unit and the initial setting storage unit when the count value becomes larger than a predetermined value.

15. The non-volatile semiconductor storage device according to claim 14, wherein
the memory cell array is a NAND memory cell array comprising a plurality of NAND cells arranged therein, each of the NAND cells including a plurality of the memory cells connected in series, and
one block is formed of the plurality of the NAND cells which share a word line for selecting the memory cells; and
the erase operation is executed per the block.

16. The non-volatile semiconductor storage device according to claim 14, wherein the second comparator updates a value of the erase start voltage from a first value to a second value which is larger than the first value by the step-up voltage.

17. The non-volatile semiconductor storage device according to claim 1, wherein:
the controller is configured such that it can execute a soft-program operation for narrowing a distribution range of the threshold voltage of the memory cell in which data is erased;
the first storage unit stores a value of a soft-program voltage applied to the memory cell when the soft-program operation is executed in addition to a value of the erase start voltage; and
the second comparator updates a value of the erase start voltage stored in the first storage unit when the count value becomes larger than a predetermined value, and updates a value of the soft-program voltage.

18. The non-volatile semiconductor storage device according to claim 17, wherein the second comparator updates a value of the erase start voltage from a first value to a second value which is larger than the first value by the step-up voltage.

* * * * *